US008188665B2

(12) United States Patent
Rittner et al.

(10) Patent No.: US 8,188,665 B2
(45) Date of Patent: May 29, 2012

(54) LIGHT EMITTING DIODE WITH ENERGY RECOVERY SYSTEM

(75) Inventors: Wolfgang Rittner, Siblin (DE); Rudiger Meckes, Berkenthin (DE); Gunter Boomgaarden, Scharbeutz (DE)

(73) Assignee: Intertechnique, S.A. (FR)

( * ) Notice: Subject to any disclaimer, the term of this patent is extended or adjusted under 35 U.S.C. 154(b) by 438 days.

(21) Appl. No.: 12/538,182

(22) Filed: Aug. 10, 2009

(65) Prior Publication Data

US 2010/0084976 A1 Apr. 8, 2010

Related U.S. Application Data

(60) Provisional application No. 61/103,299, filed on Oct. 7, 2008.

(51) Int. Cl.
*H05B 37/00* (2006.01)
*H01L 33/00* (2010.01)

(52) U.S. Cl. .................. 315/55; 257/E33.075; 136/204

(58) Field of Classification Search .................... 315/55; 257/81, 99, E33.066, E33.075; 136/201, 136/204
See application file for complete search history.

(56) References Cited

U.S. PATENT DOCUMENTS

| | | | | |
|---|---|---|---|---|
| 2004/0155251 | A1 | 8/2004 | Abramov et al. | |
| 2005/0088588 | A1 | 4/2005 | Lee | |
| 2006/0237730 | A1* | 10/2006 | Abramov | 257/81 |
| 2009/0072255 | A1* | 3/2009 | Takahashi et al. | 257/98 |

FOREIGN PATENT DOCUMENTS

| | | |
|---|---|---|
| DE | 2333119 | 1/1975 |
| JP | 2004342557 | 12/2004 |
| JP | 2006059930 | 3/2006 |
| JP | 2007036166 | 2/2007 |

* cited by examiner

*Primary Examiner* — Daniel D Chang
(74) *Attorney, Agent, or Firm* — Dean W. Russell; Renae A. Bailey; Kilpatrick Townsend & Stockton LLP

(57) ABSTRACT

The invention relates to a light emitting diode (LED) which is electrically connected to an anode and a source. According to the invention one of the anode and the source is thermally coupled to a first heat conductor, the heat conductor being thermally coupled to a first Peltier element to convert thermal energy transmitted from and generated in the light emitting crystal when the light emitting crystal is provided with electrical energy into electrical energy.

9 Claims, 1 Drawing Sheet

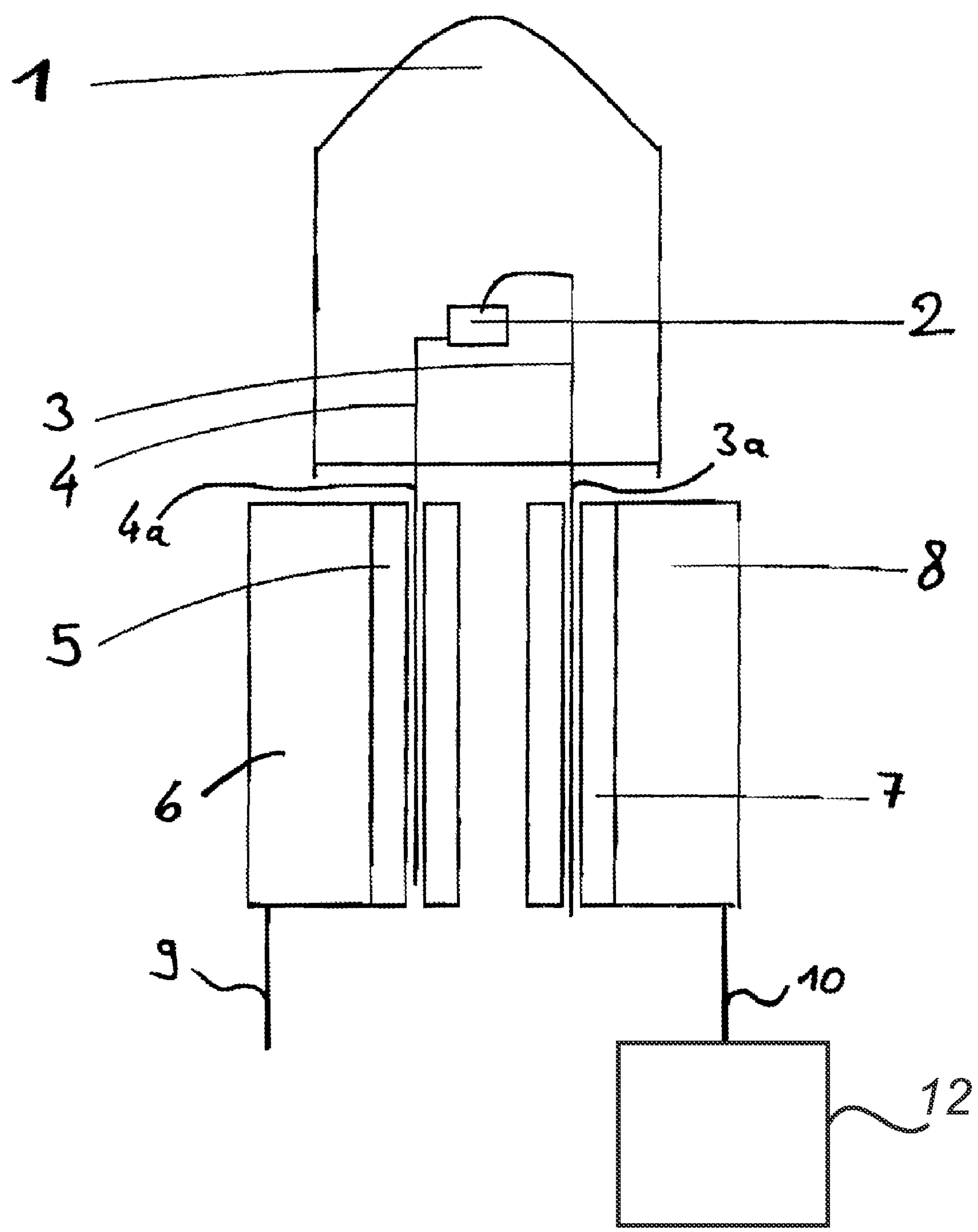
1
2
3
4
3a
4a
5
8
6
7
9
10
12

LIGHT EMITTING DIODE WITH ENERGY RECOVERY SYSTEM

CROSS REFERENCE TO RELATED APPLICATION

This application claims the benefit of U.S. Provisional Application No. 61/103,299 filed on Oct. 7, 2008, the contents of which are incorporated herein by reference.

BACKGROUND OF THE INVENTION

The invention relates to a light emitting diode (LED) which is electrically connected to an anode and a source.

Such LEDs are used in a plurality of applications wherein light is to be emitted at low energy consumption. A typical application for such LEDs is the use for signalling a specific status like a stand-by mode, an activating mode or a failure of an electrical device. In such applications, the LED is usually supplied with a small amount of energy to induce a small amount of light radiation from the LED sufficient to effect the signalling. In other applications LEDs are used to illuminate a field or region for a use like e.g. in a hand torch or a lamp installed in a vehicle like a car or an aircraft. In such appliances a high amount of energy is provided to the LED to induce a high amount of light radiation from said LED.

In general, the LED produces as a side effect a certain amount of heat when being provided with electrical energy. This heat must be removed from the LED which is usually achieved by heat radiation from the LED body or a coupling of the LED to a heat-dissipating element in order to avoid damage to the LED due to overheating.

SUMMARY OF THE INVENTION

It is an object of the invention to provide an LED which is capable to have a higher energy efficiency than LEDs according to the prior art. It is a further object of the invention to provide an LED which is capable to be driven with a small amount of energy in a first mode with high efficiency and which is capable to be driven in a second mode where the light emission from the LED is maximized.

These and other objects of the invention are achieved by providing an LED according to the introductory portion wherein one of the anode and the source is thermally coupled to a first heat conductor, the heat conductor being thermally coupled to a first Peltier element to convert thermal energy transmitted from and generated in the light emitting crystal when the light emitting crystal is provided with electrical energy into electrical energy.

According to the invention the heat generated in an LED is not dissipated into ambient air but converted into electrical energy using a peltier element. For this purpose, a first peltier element is thermally coupled to the anode or the source of the LED. By this arrangement, an LED arrangement is provided which is capable to recover at least a part of the energy which is converted into heat in the LED by converting said heat back into electrical energy and to thus provide a high efficiency of the whole arrangement. Thus, a partially self-sustaining LED arrangement is provided.

According to a first preferred embodiment, the other one of the anode and the source is thermally coupled to a second heat conductor, the second heat conductor being thermally coupled to a second Peltier element to convert thermal energy transmitted from and generated in the light emitting crystal when the light emitting crystal is provided with electrical energy into electrical energy. By this, both anode and source are each thermally coupled to a separate peltier element which results in a high recovery rate of the thermal energy generated by the LED in operation and conversion of said thermal energy into electrical energy.

It is further preferred that one or both of the first and second Peltier element are electrically coupled to an electrical storage device to store electrical energy generated in the Peltier element(s). By this, the electrical energy generated in the Peltier element(s) can be stored for later use like e.g. for providing electrical energy to the LED in an emergency situation where the regular energy supplied to the LED has failed.

Further, it is preferred that one or both of the first and second Peltier element are electrically coupled to a source of electrical energy to provide energy to the Peltier element(s) in such a way that the Peltier element(s) is are cooled. According to this preferred embodiment, the LED arrangement may be driven in a different mode of use wherein no electrical energy is converted in the Peltier elements from heat but rather electrical energy is provided to the Peltier elements to cool the Peltier elements to a low temperature. This preferred embodiment employs the specific characteristics of Peltier elements which are capable to be driven in two directions, namely to generate electrical energy from a heat gradient across the element or to create a heat difference when being provided with electrical energy. In the LED arrangement according to the invention, this is particularly useful in a situation where the LED is to be driven at a high light emission rate and thus a high amount of heat is generated by the LED which might potentially damage the LED after short time of use at such high light emission rate. The risk of being damaged can be significantly decreased and the lifetime of the LED thus increased by cooling down the one or both Peltier element(s) to a low temperature. Since the Peltier elements are thermally coupled to the LED, the LED will be cooled down to a significantly lower temperature by this and will thus be driven at a significantly lower temperature than in any other arrangement according to the prior art where the heat is dissipated into ambient air by passive heat dissipation.

According to a still further preferred embodiment, the LED arrangement comprises a control unit which is adapted to drive the light emitting diode in

- a first mode, wherein electrical energy of a first magnitude is provided to the light emitting diode and electrical energy converted from heat dissipated by the light emitting diode in the Peltier element(s) is received and provided to an electrical consumer or storage device, and in
- a second mode wherein electrical energy of a second magnitude is provided to the light emitting diode and electrical energy is provided to the Peltier element(s) to cool the Peltier elements and to thus actively cool the light emitting diode via the Peltier elements,
- wherein the second magnitude of electrical energy is higher than the first magnitude.

According to this preferred embodiment, the LED arrangement according to the invention is capable to be switched between two distinct drive modes wherein the first drive mode provides an efficient light emission at a low rate with recovery of the heat dissipated by the LED and conversion of said heat into electrical energy and the second mode allows a very high rate of light emission by the LED and an active cooling of said LED via the Peltier element by driving said Peltier element with electrical energy.

Such LED arrangement may be particularly useful in a situation where a permanent light emission is required for safety conditions in a standard operational mode but in specific situations of short time periods a high rate of light emission is required for e.g. illuminating a certain region or field.

A second aspect of the invention is a method of driving a light emitting diode, comprising the step of providing electrical energy to an anode and a source electrically coupled to a light emitting crystal incorporated in the light emitting diode, wherein the steps of transferring heat from the light emitting crystal to a Peltier element and converting said heat in said Peltier element into electrical energy, wherein said electrical energy generated in the Peltier element is preferably transferred to an electrical energy storage or an electrical consumer. Said method allows an efficient driving of an LED and a recovery of the energy dissipated as heat energy from said LED.

The method may be further improved in that the heat is transferred from the light emitting crystal to the Peltier element via electrical wires constituting the anode and/or the source.

Still further it is preferred that the heat is transferred from the light emitting crystal via an electrical wire constituting the anode coupling to a first Peltier element and via an electrical wire constituting the source coupling to a second Peltier element.

Finally it is preferred that electrical energy is provided to at least one Peltier element and the Peltier element is cooled down by this electrical energy if the light radiation emitted by the light emitting crystal is increased.

BRIEF DESCRIPTION OF THE DRAWING

A preferred embodiment of the invention is described with reference to the figure.

The FIGURE shows an LED body 1 incorporating a light emitting crystal 2 which is coupled to an anode 3 and a source 4.

DETAILED DESCRIPTION

The anode 3 and the source 4 are constituted by electrical wires 3*a*, 4*a* which exit the LED body 1 at a bottom surface.

The electrical wires are each connected to a first thermal coupling 5 and a second thermal coupling 7.

The first thermal coupling 5 is thermally coupled to a first Peltier element 6 and the second thermal coupling 7 is thermally coupled to a second Peltier element 8.

Since the Peltier elements are exposed to ambient air, the heat transferred via the electrical wires from the light emitting crystal to the Peltier element generate a heat gradient across the Peltier element.

This heat difference generates electrical energy within the Peltier elements. This electrical energy may be provided to an electrical consumer or an electrical storage device such as storage device 12. For this purpose, the Peltier elements are electrically connected to a respective wiring 9, 10.

Vice versa, via said wiring 9, 10 connected to the Peltier element the Peltier elements may be provided with electrical energy. This will cool down the Peltier elements and will thus generate a significant temperature difference between the Peltier elements and the light emitting crystal of the LED. Thus, a significant amount of heat may be transferred from the light-emitting crystal 2 to the Peltier elements via heat conducting elements 5, 6. This will allow to drive the light emitting crystal at a very high light emission rate without the danger of damaging said light emitting crystal or any other parts of the LED for thermal reasons.

The invention claimed is:

1. A light emitting diode arrangement comprising a light emitting diode with a light emitting crystal electrically connected to an anode and a source, characterized in that one of the anode and the source is thermally coupled to a first heat conductor, the heat conductor being thermally coupled to one or more Peltier elements to, in a first mode, convert thermal energy transmitted from and generated in the light emitting crystal when the light emitting crystal is provided with electrical energy at a first level into electrical energy, and further comprising a control unit adapted to drive the light emitting diode between the first mode and a second mode, wherein in the second mode, electrical energy of a second level is provided to the light emitting diode and electrical energy is provided to the one or more Peltier elements to cool the one or more Peltier elements and to thus actively cool the light emitting diode via the one or more Peltier elements.

2. The light emitting diode arrangement according to claim 1 wherein the other one of the anode and the source is thermally coupled to a second heat conductor, the second heat dissipating body being thermally coupled to a second Peltier element to convert thermal energy transmitted from and generated in the light emitting crystal when the light emitting crystal is provided with electrical energy into electrical energy.

3. The light emitting diode arrangement according to claim 1 wherein the one or more Peltier elements are electrically coupled to an electrical storage device to store electrical energy generated in the one or more Peltier elements.

4. The light emitting diode arrangement according to claim 1 wherein the one or more Peltier elements are electrically coupled to a source of electrical energy to provide energy to the one or more Peltier elements in such a way that the one or more Peltier elements is cooled.

5. The light emitting diode arrangement according to claim 1 wherein the electrical energy converted by the one or more Peltier elements is received and provided to an electrical consumer or storage device and wherein the second level of electrical energy is higher than the first level.

6. A method of driving a light emitting diode comprising the steps of:

in a first mode, providing electrical energy at a first level to an anode and a source electrically coupled to a light emitting crystal incorporated in the light emitting diode and transferring heat from the light emitting crystal to one or more Peltier elements and converting said heat in said one or more Peltier elements into electrical energy, wherein said electrical energy generated in the one or more Peltier elements is preferably transferred to an electrical energy storage or an electrical consumer; and in a second mode, providing electrical energy of a second level that is higher than the first level to the light emitting diode and providing electrical energy to the one or more Peltier elements to cool the one or more Peltier elements and to thus actively cool the light emitting diode via the one or more Peltier elements.

7. The method according to claim 6 wherein the heat is transferred from the light emitting crystal to the one or more Peltier elements via electrical wires constituting the anode and/or the source.

8. The method according to claim 6 wherein the heat is transferred from the light emitting crystal via an electrical wire constituting the anode coupling to a first Peltier element and via an electrical wire constituting the source coupling to a second Peltier element.

9. The method according to claim 6 wherein electrical energy is provided to the one or more Peltier elements and the one or more Peltier elements is cooled down by this electrical energy if the light radiation emitted by the light emitting crystal is increased.

* * * * *